US010718841B2

(12) United States Patent
Alsop et al.

(10) Patent No.: US 10,718,841 B2
(45) Date of Patent: Jul. 21, 2020

(54) SYSTEM AND METHOD FOR IMPROVED HOMOGENEOUS AND INHOMOGENEOUS MAGNETIZATION TRANSFER MAGNETIC RESONANCE IMAGING

(71) Applicant: Beth Israel Deaconess Medical Center, Inc., Boston, MA (US)

(72) Inventors: David Alsop, Newton, MA (US); Gopal Varma, Boston, MA (US)

(73) Assignee: Beth Israel Deaconess Medical Center, Inc., Boston, MA (US)

( * ) Notice: Subject to any disclaimer, the term of this patent is extended or adjusted under 35 U.S.C. 154(b) by 67 days.

(21) Appl. No.: 16/069,245

(22) PCT Filed: Jan. 17, 2017

(86) PCT No.: PCT/US2017/013760
§ 371 (c)(1),
(2) Date: Jul. 11, 2018

(87) PCT Pub. No.: WO2017/124089
PCT Pub. Date: Jul. 20, 2017

(65) Prior Publication Data
US 2019/0033412 A1 Jan. 31, 2019

Related U.S. Application Data

(60) Provisional application No. 62/278,910, filed on Jan. 14, 2016.

(51) Int. Cl.
*G01R 33/56* (2006.01)
(52) U.S. Cl.
CPC ..... *G01R 33/5605* (2013.01); *G01R 33/5608* (2013.01)

(58) Field of Classification Search
CPC ............ G01R 31/2601; G01R 31/3183; G01R 31/319; G01R 31/2612; G01R 31/261; G01R 31/2623
See application file for complete search history.

(56) References Cited

U.S. PATENT DOCUMENTS 6,603,989 B1 * 8/2003 Yablonskiy ............ G01R 33/50
600/410
8,198,891 B2 * 6/2012 Sacolick .............. G01R 33/583
324/307
(Continued)

FOREIGN PATENT DOCUMENTS

WO 2014/151596 9/2014
WO 2017182229 10/2017

OTHER PUBLICATIONS

International Search Report and Written Opinion for International Patent Application No. PCT/US2017/013760 dated Mar. 14, 2017.
(Continued)

*Primary Examiner* — Dominic E Hawkins
(74) *Attorney, Agent, or Firm* — Quarles & Brady LLP

(57) ABSTRACT

A system and methods for improved homogeneous and inhomegeneous magnetic transfer imaging are provided. In some aspects, a plurality of gradient coils and an RF system of a magnetic resonance imaging ("MRI") system are controlled, using a computer, to perform, at least one pulse sequence that includes a preparation module followed by an imaging module, wherein the preparation module comprises a plurality of radio frequency ("RF") saturation pulses applied according to a concentrated pulse cycle to manipulate exchangeable magnetization from protons in the subject, and the imaging module is configured to acquire image data. The computer is also configured to analyze the image data acquired to generate frequency information indicative of the exchangeable magnetization from protons in the subject, and
(Continued)

generate a report, using the frequency information, pertaining to inhomogeneous or homogeneous magnetization transfer occurring in the subject.

23 Claims, 7 Drawing Sheets

(56) References Cited

U.S. PATENT DOCUMENTS

| | | | | |
|---|---|---|---|---|
| 10,004,422 | B2* | 6/2018 | Alsop | G01R 33/5601 |
| 2007/0108976 | A1 | 5/2007 | Morich et al. | |
| 2010/0301862 | A1* | 12/2010 | Tropp | G01R 33/3415 |
| | | | | 324/318 |
| 2011/0241669 | A1* | 10/2011 | Chen | G01R 33/5611 |
| | | | | 324/309 |
| 2011/0279117 | A1* | 11/2011 | Alford | A61K 49/103 |
| | | | | 324/307 |
| 2013/0190601 | A1* | 7/2013 | Alsop | G01R 33/5601 |
| | | | | 600/410 |
| 2013/0342206 | A1* | 12/2013 | Ugurbil | G01R 33/4835 |
| | | | | 324/309 |
| 2013/0342207 | A1 | 12/2013 | Keupp et al. | |
| 2014/0070803 | A1 | 3/2014 | Jin et al. | |
| 2015/0338483 | A1* | 11/2015 | Sun | G01R 33/5605 |
| | | | | 324/309 |
| 2016/0041246 | A1* | 2/2016 | Alsop | A61B 5/4041 |
| | | | | 324/309 |
| 2016/0116559 | A1* | 4/2016 | Cohen | G01R 33/561 |
| | | | | 324/309 |
| 2016/0334485 | A1* | 11/2016 | Miyoshi | G01R 33/5605 |
| 2017/0119259 | A1* | 5/2017 | Giri | A61B 5/0263 |

OTHER PUBLICATIONS

European Patent Office, Extended European Search Report for application 17739146.3, dated Aug. 23, 2019.
Manning, A. P., et al. "The physical mechanism of "inhomogeneous" magnetization transfer MRI." Journal of Magnetic Resonance 274 (2017): 125-136.
Prevost, V.H., et al. "Magnetization transfer from inhomogeneously broadened lines (ihMT): application on multiple sclerosis (MS)." Proceedings of the 23rd Annual Meeting of ISMRM. 2015.
Varma, G., et al. "Increasing the inhomogeneous magnetization transfer (ihMT) signal in vivo with high amplitude, low duty cycle irradiation." ISMRM Annual Meeting, Singapore. 2016.
Varma, G., et al. "Interpretation of magnetization transfer from inhomogeneously broadened lines (ihMT) in tissues as a dipolar order effect within motion restricted molecules." Journal of Magnetic Resonance 260 (2015): 67-76.
Varma, G., et al. "Low duty-cycle pulsed irradiation reduces magnetization transfer and increases the inhomogeneous magnetization transfer effect." Journal of Magnetic Resonance 296 (2018): 60-71.
Dortch, R.D. et al, Quantitative magnetization transfer imaging of human brain at 7 T, Neuroimage 64 (2012) 640-649.
Duhamel, G. et al, Magnetization transfer from inhomogeneously broadened lines (ihMT): effect of MT asymmetry on the ihMT signal, in: Proc. 22nd Sci. Meet. Int. Soc. Magn. Reson. Med., 2014, p. 209.

Girard, O.M., et al. "Magnetization transfer from inhomogeneously broadened lines (ihMT): experimental optimization of saturation parameters for human brain imaging at 1.5 Tesla." Magnetic resonance in medicine 73.6 (2015): 2111-2121.
Girard, O.M., et al. "Whole brain inhomogeneous MT using an ihMT prepared 3D GRE sequence at 1.5 T." Proc. Intl. Soc. Mag. Reson. Med. vol. 23. 2015.
Henkelman, R.M. et al, Quantitative interpretation of magnetization transfer, Magn. Reson. Med. 29 (1993) 759-766.
Lee, J.S. et al, Concurrent saturation transfer contrast in in vivo brain by a uniform magnetization transfer MRI, Neuroimage 95 (2014) 22-28, http://dx.doi.org/10.1016/j.neuroimage.2014.03.040.
Lee, J.S. et al, Isolating chemical exchange saturation transfer contrast from magnetization transfer asymmetry under two-frequency rf irradiation, J. Magn. Reson. 215 (2011) 56-63, http://dx.doi.org/ 10.1016/j.jmr.2011.12.012.
Lee, J.S. et al, Uniform magnetization transfer in chemical exchange saturation transfer magnetic resonance imaging, Sci. Rep. 3 (2013) 1707, http://dx.doi.org/10.1038/srep01707.
Lee, J.S. et al, Uniform saturation of a strongly coupled spin system by two-frequency irradiation, J. Chem. Phys. 134 (2011) 234504, http://dx.doi.org/10.1063/1.3600758.
Levesque, I.R., et al., Reproducibility of quantitative magnetization-transfer imaging parameters from repeated measurements, Magn. Reson. Med. 64 (2010) 391-400, http://dx.doi.org/10.1002/mrm.22350.
Lin et al. "Reduction of RF power for magnetization transfer with optimized application of RF pulses in k-space." Magnetic Resonance in Medicine: An Official Journal of the International Society for Magnetic Resonance in Medicine 50.1 (2003): 114-121.
"McHinda S, et al. Whole brain inhomogeneous magnetization transfer (ihMT) imaging: Sensitivity enhancement within a steady-state gradient echo sequence. Magn Reson Med. May 2018;79(5):2607-2619. doi: 10.1002/mrm.26907".
Morrison, C. et al, A model for magnetization transfer in tissues, Magn. Reson. Med. 33 (1995) 475-482.
Morrison, C. et al, Modeling magnetization transfer for biological-like systems using a semi-solid pool with a super-Lorentzian lineshape and dipolar reservoir, J. Magn. Reson. Ser. B 108 (1995) 103-113.
Neufeld, A. et al, New MRI method with contrast based on the macromolecular characteristics of tissues, Magn. Reson. Med. 50 (2003) 229-234, http://dx.doi.org/10.1002/mrm.10546.
Varma et al. "3D acquisition of the inhomogeneous magnetization transfer effect for greater white matter contrast" Proceedings of the 21st Annual Meeting of ISMRM, Salt Lake City, Utah, USA. 2013.
Varma G, et al. In vivo measurement of a new source of contrast, the dipolar relaxation time, T1D, using a modified inhomogeneous magnetization transfer (ihMT) sequence. Magn Reson Med. Oct. 2017;78(4):1362-1372. doi: 10.1002/mrm.26523.
Varma, G. et al, Quantitative evaluation of the exchange time and T2 associated with an inhomogeneous component asing inhomogeneous magnetization transfer imaging, in: Proc. 21st Sci. Meet. Int. Soc. Magn. Reson. Med., 2013, p. 2536.
Varma, G., Magnetization transfer from inhomogeneously broadened lines: a potential marker for myelin, Magn. Reson. Med. 73 (2015) 614-622, http://dx.doi.org/10.1002/mrm.25174.

* cited by examiner

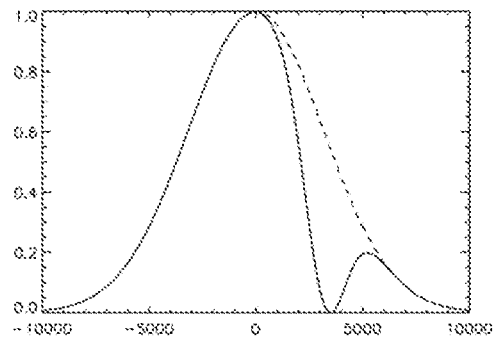 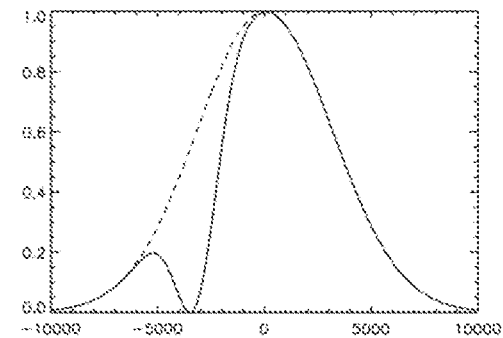
FIG. 1A  FIG. 1B
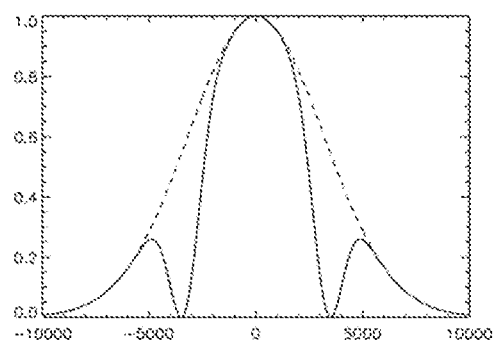 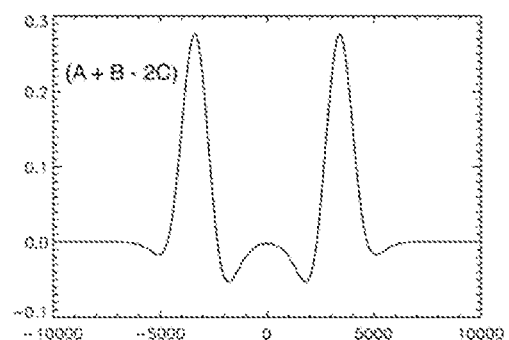
FIG. 1C  FIG. 1D

US 10,718,841 B2

SYSTEM AND METHOD FOR IMPROVED HOMOGENEOUS AND INHOMOGENEOUS MAGNETIZATION TRANSFER MAGNETIC RESONANCE IMAGING

CROSS-REFERENCE TO RELATED APPLICATIONS

This application represents the U.S. National Stage of International Application No. PCT/US2017/013760, filed Jan. 17, 2017 which is based on, claims priority to, and incorporates by reference herein in its entirety U.S. Provisional Application Serial No. 62/278,910 filed on Jan. 14, 2016 and entitled "SYSTEM AND METHOD FOR IMPROVED HOMOGENOUS AND INHOMOGENOUS MAGNETIZATION TRANSFER MAGNETIC RESONANCE IMAGING."

STATEMENT REGARDING FEDERALLY SPONSORED RESEARCH

N/A

BACKGROUND

The present disclosure relates to systems and methods for magnetic resonance ("MW") imaging. More particularly, the invention relates to systems and methods for magnetization transfer ("MT") using MR techniques.

Any nucleus that possesses a magnetic moment attempts to align itself with the direction of the magnetic field in which it is located. In doing so, however, the nucleus precesses around this direction at a characteristic angular frequency (Larmor frequency), which is dependent on the strength of the magnetic field and on the properties of the specific nuclear species (the magnetogyric constant γ of the nucleus). Nuclei which exhibit these phenomena are referred to herein as "spins."

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. A net magnetic moment $M_Z$ is produced in the direction of the polarizing field, but the randomly oriented magnetic components in the perpendicular, or transverse, plane (x-y plane) cancel one another. If, however, the substance, or tissue, is subjected to a transient electromagnetic pulse (excitation field $B_1$) which is in the x-y plane and which is near the Larmor frequency, the net aligned moment, $M_Z$, may be rotated, or "tipped", into the x-y plane to produce a net transverse magnetic moment $M_t$, which is rotating, or spinning, in the x-y plane at the Larmor frequency. The practical value of this phenomenon resides on signals that are emitted by the excited spins after the pulsed excitation signal $B_1$ is terminated. Depending upon chemically and biologically determined variable parameters such as proton density, longitudinal relaxation time ("$T_1$") describing the recovery of $M_Z$ along the polarizing field, and transverse relaxation time ("$T_2$") describing the decay of $M_t$ in the x-y plane, this nuclear magnetic resonance ("NMR") phenomena is exploited to obtain image contrast and concentrations.

Magnetic resonance imaging ("MRI") can provide unique information about the chemical and molecular environment of imaged samples or tissues compared to other modalities. One type of measurement is broadly termed magnetization transfer ("MT"), and involves measuring signals from nuclei of hydrogen atoms whose motion is restricted because they are bound to macromolecules. These so-called "bound pool" spins or spin species have very short transverse relaxation times $T_2$ due to tight coupling to their environment, and are hence difficult to image. This is because in traditional MRI methods, $T_2$ needs to be sufficiently long (i,e, greater than about 10 ms) to allow for spatial encoding gradients between excitation and acquisition to be played out before signals are completely decayed. For some bound pool spin species, however, $T_2$ can be as short as 10-50 µs.

Even though bound pool spin signals decay rapidly due to short $T_2$, they can exchange magnetization with so-called "free pool" spins, which are loosely bound to their environment, and typically present as water protons in many soft tissue environments. The magnetization exchange, occurring via various spin exchange processes, allows the properties of the bound pool to be probed by the application of RF excitations. In particular, applied excitations at frequencies offset from water would have little direct effect on the free pool, but will saturate the bound pool, and generate measurable signals. This is because, in general, hound pool spins have a much broader absorption line shapes compared to free pool spins, making them more sensitive to appropriate off-resonance irradiation. As a result, characteristics of macromolecular components of tissue that would otherwise be unobservable because of their very short $T_2$ can be measurable.

In traditional MT measurements, RF saturation power is applied at one off-resonance frequency and signal effects are observed, typically in the steady state. In some alternatives, different RF power and off-resonance frequencies may be used, and fit to quantitative models with potentially more specificity. However, such models assume a single transferring compartment with a single line shape, and can produce similar results for very different tissues.

Therefore, there is a need for improved magnetization transfer MRI techniques that provide high sensitivity to tissue differences and can overcome constraints of the limited safe power range.

SUMMARY

The present disclosure overcomes the shortcomings of previous techniques by providing systems and methods directed to improved magnetization transfer ("MT") imaging. In some configurations, an imaging pulse sequence including short bursts of higher power MT irradiation may be used to enhance the power efficiency of IHMT. In other configurations, short bursts of irradiation may be used in comparison with more evenly distributed irradiation, to characterize those components of the MT signal that reflect more nonlinear response with power, either because of dipolar order or slower exchange. As will be appreciated from descriptions herein, the present approach may be used for homogeneous and inhomogeneous magnetization transfer ("IHMT") magnetic resonance imaging ("MRI") techniques.

In accordance with one aspect of the disclosure, a magnetic resonance imaging (MRI) system is provided. The system includes a magnet system configured to generate a polarizing magnetic field about at least a region of interest ("ROI") of a subject arranged in the MRI system, a plurality of gradient coils configured to apply a gradient field with respect to the polarizing magnetic field, and a radio frequency ("RF") system configured to apply RF excitation fields to the subject and acquire MR image data therefrom. The system also includes a computer programmed to control the plurality of gradient coils and RF system to perform at least one pulse sequence that includes a preparation module followed by an imaging module, wherein the preparation module comprises a plurality of RF saturation pulses applied according to a concentrated pulse cycle to manipulate exchangeable magnetization from protons in the subject, and the imaging module is configured to acquire image data. The computer is also programmed to analyze the image data acquired to generate frequency information indicative of the exchangeable magnetization from protons in the subject, and generate a report, using the frequency information, pertaining to inhomogeneous or homogeneous magnetization transfer occurring in the subject.

In accordance with another aspect of the disclosure, a method is provided for producing a report about a subject from data collected from the subject using a magnetic resonance imaging (MRI) system. The method includes directing the MRI system to perform at least one pulse sequence that includes performing a preparation module and an imaging module. The preparation module includes applying a plurality of radio frequency (RF) pulses at least at one frequency at a concentrated pulse cycle to manipulate exchangeable magnetization from protons in the subject. The imaging module includes acquiring, image data including magnetization transfer information from the exchangeable magnetization from protons in the subject in response to the pulse sequence. The method also includes analyzing the effects of the RE energy on the image data to identify inhomogeneous lines formed by a summation of multiple sublines centered at multiple different frequencies and generating a report pertaining to inhomogeneous magnetization transfer occurring in the subject in response to the pulse sequence based on the inhomogeneous lines identified.

In accordance with another aspect of the disclosure, a method is provided for producing a report about a subject from data collected from the subject using a magnetic resonance imaging ("MRI") system. The method includes directing the MRI system to perform at least one pulse sequence that includes performing a preparation module and an imaging module. The preparation module includes applying a plurality of radio frequency ("RF") pulses at least at one frequency and with a concentrated pulse cycle to manipulate exchangeable magnetization from protons in the subject. The imaging module includes acquiring, image data including magnetization transfer information from the exchangeable magnetization from protons in the subject in response to the pulse sequence. The method also includes directing the MRI system to perform at least one pulse sequence that includes performing a preparation module and an imaging module. The preparation module includes applying a plurality of RF pulses at least at one frequency and with a distributed pulse cycle to manipulate exchangeable magnetization from protons in the subject. The imaging module includes acquiring, image data including magnetization transfer information from the exchangeable magnetization from protons in the subject in response to the pulse sequence. The method further includes analyzing the different effects of RF energy on the image data to identify inhomogeneous lines formed by a summation of multiple sublines centered at multiple different frequencies or to characterize the exchange times of homogenous or inhomogeneous lines. The method further includes generating a report pertaining to inhomogeneous magnetization transfer or homogeneous magnetization transfer occurring in the subject in response to the pulse sequence based on the inhomogeneous lines and/or exchange time effects identified.

The foregoing and other aspects and advantages of the invention will appear front the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

BRIEF DESCRIPTION OF THE DRAWINGS

FIG. 1A is a graph illustrating an image data set under a positive frequency irradiation.

FIG. 1B is a graph illustrating an image data set obtained under a negative frequency irradiation having the same power as the image data set of FIG. 1A.

FIG. 1C is a graph illustrating an image data set obtained under a dual frequency irradiation, having both a negative and a positive frequency irradiation, and each of the negative and the positive frequency has one half of the power of that used in image data set of FIGS. 1A and 1B.

FIG. 1D is a graph illustrating an IHMT image data set after subtracting two times a dual frequency image from the data set of FIG. 1C from the sum of the positive image data set of FIG. 1A and negative image data set of FIG. 1B.

DETAILED DESCRIPTION

Figure 2:
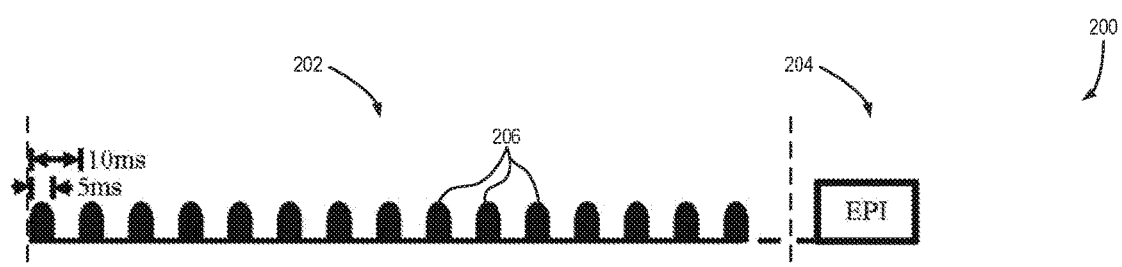
FIG. 2 is a pulse sequence diagram illustrating an IHMT pulse sequence in accordance with the present disclosure.

The present disclosure provides a novel system and methods directed to magnetization transfer ("MT") imaging. Specifically, MT is a magnetic resonance imaging ("MRI")

technique can be used to elicit information from specific molecular targets by virtue of magnetization exchange between "bound pool" and "free pool" spins or spin species. In particular, bound pool spins, such as protons in large molecules, have very short transverse relaxation times $T_2$ and are very difficult to image due to timing requirements between excitation and data acquisition. Since bound pool spins have restricted motion, some may experience positive coupling with nearby spins while others experience a negative coupling. As such, bound pool spins can have different resonance conditions, and quickly become out of phase. From a frequency perspective, such dephasing results in broad resonance frequency peaks or "broad lines." By contrast, spins in the free pool, such as protons in water, do not exhibit a broad line because they are moving quickly relative to each other such that positive and negative interactions quickly average away.

During imaging, the spin state of bound pool protons can be utilized to influence the spin state of water protons through various exchange processes. Herein, the exchange relates to processes that transfer magnetization, via spin interactions, diffusion and other processes, rather than an exchange of protons, or other spin species. Specifically, the exchangeable magnetization of bound pool protons can be saturated, using radio-frequency ("RF") energy or RF power applied at an off-resonance frequency, relative to water, and the saturation can be subsequently transferred to the free water protons. Depending upon the rate of exchange between the two spin populations, it is the transfer of saturation that forms contrast mechanism in MT imaging.

Inhomogeneous magnetization transfer ("IHMT") is a type of MT imaging that can provide more tissue specific signal contrast by comparing or combining MT signals from a single frequency with those from a dual frequency (±the single frequency offset). IHMT has been described in co-pending U.S. application Ser. No. 14/776,872, and is incorporated herein by reference in its entirety. In IHMT MRI, protons that contribute to the inhomogeneous component of magnetization transfer, for example, because of their restricted motion and slow spin diffusion, are also referred to as IHMT protons or IHMT contributing protons. In some applications, IHMT may be used to image methylene ($-CH_2-$) chains in lipid bilayers in myelin, for example, as well as other functionally equivalent groups having exchangeable magnetization of protons. In particular, the IHMT effect can be modeled as a dipolar order effect, which can attenuate the impact of single frequency irradiation, especially at very high irradiation powers. In practice, however, high RF power introduces safety concerns, due to the potential of tissue heating or coil burns.

The present disclosure recognizes that in most large molecules, such as proteins, small motions of the nuclei and the coupling across large numbers of protons produce spin diffusion that causes gradual modulation of the positive and negative couplings. For smaller molecules, rotation can also rapidly average the positive and negative effects. As a result, saturating RF power applied at one frequency not only affect those protons, but is spread, by spin diffusion and rotation processes, across all frequencies. This response is known as "homogenous broadening," and generally assumed for in-vivo magnetization transfer. However, situations without this spread of saturation across frequencies may occur in some chemical species, such as small molecules with just a few protons that are rotationally restricted. Such broadening without mixing across frequencies is known as "inhomogeneous broadening." When analyzing frequency information, an inhomogeneous line may include multiple sublines associated with the protons that are rotationally restricted.

A general feature of homogenously broadened lines is that RF power applied at one frequency will have a similar effect to power applied at a different frequency as long as the amplitude is adjusted to achieve similar saturation. That is, the MT effect at a positive frequency is very similar or virtually identical with that at negative frequency. Hence, applying power split between a positive and negative frequency can provide the same saturation as applying the full power at one frequency (either positive or negative).

Over time, small errors have been observed in the performance of various imaging techniques that were, without a full understanding of the underlying phenomenon, attributed to MT effects. For example, residual errors were noticed in some perfusion imaging techniques. In some aspects of the present disclosure, a three-fold subtraction using three different images may be performed to address such issues. Alternating positive and negative frequency pulses of irradiation may be applied. In addition, the frequency for positive and negative pulses may be within the width of the inhomogeneous line from methylene ($-CH_2-$) chains, such as in lipid bilayers in myelin.

Referring now to FIGS. 1A-1D, a set of graphs are shown that illustrate the basic concept of IHMT. Specifically, three image data sets are illustrated in FIGS. 1A-1D. FIG. 1A shows the first image data set obtained under a positive frequency irradiation using an applied RF power. FIG. 1B shows the second image data set obtained under a negative frequency irradiation, and using the same power applied in obtaining the first image data set. FIG. 1C shows the third image data set obtained under a dual frequency irradiation, namely negative and positive frequency irradiation, each with half of the power used for the first and second image data sets. Since magnetization at a particular frequency is saturated by the applied RF power, it will likely be mostly saturated using half of the applied RF power. Hence, the third image data set of FIG. 1C shows more attenuation of the line following dual frequency irradiation. In one example, as shown in FIG. 4D, a fourth image data set may be produced by subtracting two times the third image data set (dual frequency) from the sum of the first image data set (positive frequency) and second image data set (negative frequency). As appreciated from FIG. 1D, only the inhomogeneous broadening remained, while the homogeneous broadening was canceled. Mathematically, this can be represented as:

$$IHMT_1 = A + B - 2C \qquad \text{Eqn. (1);}$$

where A represents the first image data set (positive frequency), B represents the second image data set (negative frequency), and C represents the third image data set (dual frequency). In accordance with aspects of the present disclosure, the resulting fourth image data set of FIG. 1D may be used to produce one or more IHMT images.

In accordance with aspects of the present disclosure, various combinations of image data sets, as described, may be used to produce various IHMT images. For example, IHMT images may be produced by subtracting a dual frequency image data from a single frequency image data (either positive or negative). This is termed "direct subtraction" and defined as follows $$IHMT_2 = A - C \qquad \text{Eqn. (2);}$$

$$IHMT_3 = B - C \qquad \text{Eqn. (3);}$$

In direct subtraction, small asymmetries of MT or field nonuniformities may causes errors. To this end, Eqn. 1 may be used to provide a first order correction for these errors.

In another example, two separate or different dual frequency image data sets or images may be used to obtain IHMT images having optimal signal-to-noise ratio. That is, rather than multiplying a single dual frequency image or image data set by two, as in Eqn. 1, two separate dual frequency images or image data sets that are acquired independently may be preferable.

In yet another example, image data sets obtained by simultaneous application of RF power at two different frequencies having the same polarity (e.g. positive or negative offsets) may be used to produce IHMT images. In some aspects, this may be achieved by sinusoidally modulating an RF pulse to produce power at both frequencies simultaneously. Sinusoidally modulated pulses for simultaneous dual frequency modulation provide significant advantages since the bandwidth, defined by the envelope amplitude, may be made narrow while producing dual frequency modulation. Comparably, when pulses are used, they must be kept short, thus having high bandwidth. Further, the gap between positive and negative pulses in IHMT can be an important parameter affecting the signal of the resulting image.

In sonic applications, IHMT imaging can be used, for example, to target methylene (—$CH_2$—) chains in lipid bilayers as magnetization transfer agents. These protons only weakly interact with other protons due to the frequent bending of the methylene bonds, as described by Seiter and Chan in *H J Am Chem Soc* 95(23):7541-53 1973 and by Chan, et al., in *Nature* 231:110-112 1971. However, to fully harness IHMT as a contrast mechanism, it is helpful to understand the underlying physical phenomenon. Thus, a series of experiments to further characterize the behavior of the IHMT signal were performed.

First, the timescale over which one could switch between positive and negative frequencies was investigated. While seeking to characterize this timescale, it was discovered that switching on a timescale longer than the spin diffusion time for protons in methylene chains caused a reduction in the signal. An example of the this time scale is approximately 5 ms, which is in reasonable agreement with the expectations for diffusion times of methylene chains in lipid bilayers and has been estimated at around 8 ms by Feigenson and Chan, in *H J Am Chem Soc* 96(5):1312-9 1974. This estimate of exchange time was found to be highly insensitive to the assumed $T_2$ of the protons.

For example, using a imaging pulse sequence having a saturation scheme at a positive, negative, and combined offset frequency, in which the offset alternates between the two frequencies, the exchange time of the IHMT contrast mechanism could be determined. Using a two-pool model for exchange, in which irradiation at the positive offset is assumed to be disconnected from that at the negative offset, the IHMT effect could be modeled based on the assumption of saturation of a single line. The magnetization change following irradiation at the positive offset is given by:

$$\frac{\partial M_{ON}}{\partial t} = M_0 R_{ex} - M\left(R_{ex} + \frac{\omega_1^2 T_2}{1 + \Delta^2 T^2}\right);$$ Eqn. (4)

while during periods of negative offset saturation the magnetization is given by:

$$\frac{\partial M_{OFF}}{\partial t} = M_0 R_{ex} - M R_{ex};$$ Eqn. (5)

and recovers on a timescale $R_{ex}=1/\tau_{ex}$, assuming $R_{ex} \gg R_1$. In relation to an alternating frequency offset scheme associated with IHMT, the average magnetization, $M_{av}$, is thus given by the integral of $M_{ON}$ as:

$$M_{ON}=M_1 e^{-R'ex t}+M_0(1-e^{-R'ex t})$$ Eqn. (6);

from t=0 to t=w and $M_{OFF}$ as:

$$M_{OFF}=(M_1 e^{-R'ex w}+M'_0(1-e^{-R'ex w}))e^{-(1-w)R_R}+M_0(1-e^{-(1-w)R_1})$$ Eqn. (7);

from t=w to t=2w, divided by 2w, where $R'_{ex}=R_{ex}+\omega_1^2 T_2/(1+\Delta^2 T_2^2)$, $M'_0=M_0 R_{ex}/R'_{ex}$, $M_1$ is the steady-state magnetization at t=w, where $M_{ON}=M_{OFF}$, and w is the saturation period. For sufficiently high RF power, this expression becomes independent of T2 and the dependence on w can be used to estimate Rex. (8);

Once Rex is estimated as above, $T_2$ can be estimated from measuring IHMT at several different powers of applied RF. The ratio ("IHMTR") may be calculated as $M_{ON}+M_{OFF}-2M_{av})/M_0$. Adopting a continuous wave ("CW") scheme to investigate saturation the average magnetization, $M_{av}$, may be given by:

$$M_{av} = \frac{M_0 R_{ex}}{\left(R_{ex} + \frac{\omega_1^2}{2} T_2 \frac{1}{1+\Delta^2 T_2^2}\right)};$$ Eqn. (8)

so that IHMT equals $M_0 T_2^2 \omega_1^4/((R_{ex}+T_2 \omega_1^2)(2R_{ex}+T_2 \omega_1^2))$. With this information in hand, the exchange time, $\tau_{ex}$ and $T_2$ associated with an inhomogeneous component can be determined with IHMT. Furthermore, distinct values for exchange time correlate with clinical indications. As such, exchange time can be used as a mechanism to investigate clinical indications, including those that have and can be difficult to diagnose, such as traumatic injury and others. In such settings, a 3D pulse sequence, such as described below, may be advantageous.

Using an estimate of the exchange time, the $T_2$ of the signal could be estimated because saturation depends on $T_2$ and the exchange time. A pulse sequence with a short period of RF irradiation was used. To focus the bandwidth, a constant amplitude pulse with a duration approximately between 50 and 100 ms was used and modulated sinusoidally to achieve dual frequency irradiation. By varying the pulse power, near saturation of the IHMT effect was achieved, thereby allowing for estimation of $T_2$. $T_2$s were measured in the 200 μs range, consistent with prior studies of lipid membranes. Further, a spatial variation of the $T_2$, which is attributable to errors resulting from $B_1$ inhomogeneities, were present. Correction for these $B_1$ inhomogeneities can be compensated for by using a $B_1$ mapping sequence.

Though imaging of myelin provides a highly-valuable clinical information, IHMT-based imaging serves as a general contrast mechanism that can be used for a variety of clinical and non-clinical imaging and analysis techniques. For example, the IHMT contrast mechanism can be used to analyze other substances that are not necessarily organic, such as a laminar liquid crystal of fatty alcohols. Fatty alcohols, having chains of methylene protons, are can be investigated using IHMT imaging. Quantification of exemplary fatty alcohols, such as hair conditioners, showed longer diffusion times, but shorter T$_2$s than in-vivo white matter for samples. These observations also confirm the above-described IHMT contrast mechanism.

Referring now to FIG. 2, an example pulse sequence 200, in accordance with the present disclosure, is illustrated. The pulse sequence 200 may be carried out using a MRI system 700, as described with reference to FIG. 7, as well as any other suitable system. As illustrated, the pulse sequence 200 may include a preparation module 202 and an imaging module 204. The preparation module 202 may include a series of saturating RF pulses 206 that are temporally distributed. In this sense, the preparation module 202 is a "distributed" pulse module. In accordance with aspects of the present disclosure, pulses in the series of saturating RF pulses 206 may be configured to induce a magnetization exchange, as described.

The series of saturating RF pulses 206 may be either distributed uniformly, as shown in FIG. 2, non-uniformly, or in a combination of uniform and non-uniform distribution. In some aspects, the series of saturating RF pulses 206 may have 50% duty cycle, although other duty cycles may be possible. In one non-limiting example, pulses in the series of saturating RF pulses 206 may be approximately 5 ms in duration and temporally separated by 5 ms. Other pulse durations and temporal separations may also be possible.

The imaging module 204 for acquiring image data may include any of a variety of pulse sequences. For example, as shown in FIG. 2, an echo-planar imaging ("EPI") may also be used. As another non-limiting example, a spoiled gradient-echo ("SPGR") sequence with a MT module applied within each repetition time, TR may be used. Furthermore, the imaging module 204 may include a two-dimensional ("2D") or three-dimensional ("3D") pulse sequence.

Figure 3:
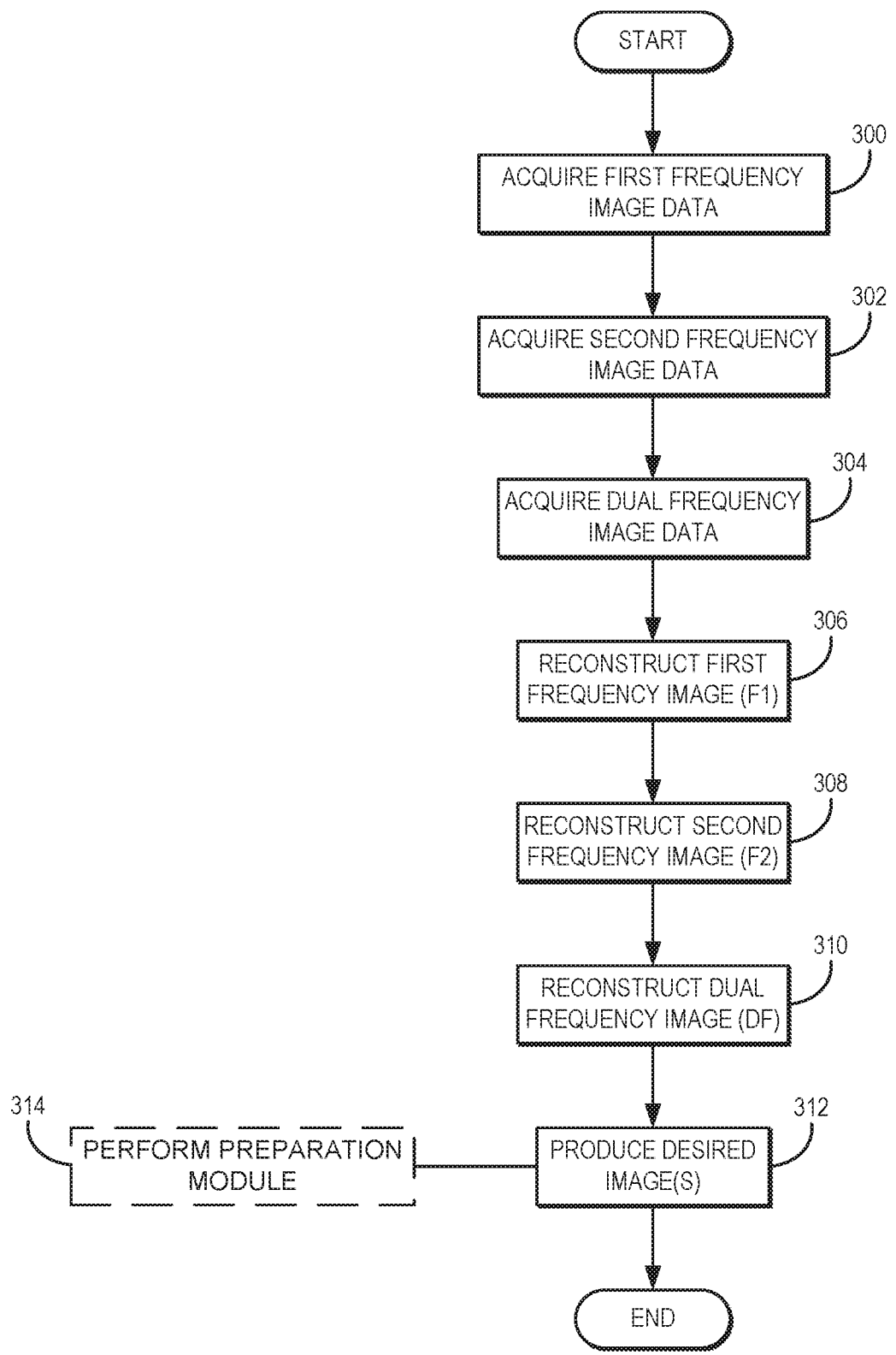
FIG. 3 is a flowchart setting forth the steps of an exemplary method for performing IHMT imaging in accordance with the present disclosure.

Referring now to FIG. 3, a flowchart setting forth the steps of a process, in accordance with aspects of the present disclosure, is shown. In some aspects, the process may be carried out using a MRI system, as described with reference to FIG. 7, to perform myelin specific imaging using inhomogeneous magnetization transfer ("IHMT").

The process may begin with the acquisition of three sets of image data, as shown in FIG. 3. The first set of image data may he acquired at step 300 using a pulse sequence that applies RF saturation energy at a first frequency; thus, this first set of image data can be referred to as first frequency image data. By way of example, the pulse sequence illustrated in FIG. 2 may be used to acquire the first frequency image data. For the first frequency image data, the frequency of each saturating RF pulse, or the continuous RF wave, is set to the first frequency, which can be selected such that some exchangeable magnetization of bound pool spins is saturated without directly saturating free water protons. For example, the first frequency can be in a range approximately between 0.5 and 20 kHz.

Likewise, the second set of image data may be acquired at step 302, using a pulse sequence that applies RF saturation energy at a second frequency that is different than the first frequency; thus, this second set of image data can be referred to as second frequency image data. By way of example, the pulse sequence illustrated in FIG. 2 can also be used to acquire the second frequency image data. For the second frequency image data set, the frequency of each RF pulse, or the continuous RF wave, is set to the second frequency. For example, the second frequency can be selected as the negative of the first frequency. In one specific example, the first and second frequencies are selected such that they are offset sufficiently far from the free water frequency to avoid saturating free water, but sufficiently close to protons of the methylene ($—CH_2—$) chains in lipid bilayers in myelin such that some of the magnetization in protons of those methylene chains is saturated.

The third set of image data, referred to as the "dual frequency" image data, is acquired at process block 304, for example, using the pulse sequence illustrated in FIG. 2. For the dual frequency image data, the frequency of the RF saturation pulses can alternate between the first and second frequencies employed in steps 300 and 302. For example, the frequency of the odd-numbered RF saturation pulses is selected as the first frequency, whereas the frequency of the even-numbered RF saturation pulses is selected as the second frequency. In an alternative, each RF saturation pulse may include two frequency bands: one centered about the first frequency and one centered about the second frequency. By way of example, continuous RF wave saturation at both a reference and labeling frequency can be achieved using amplitude modulation of the continuous RF wave, such as by:

$$B_1(t) = \sqrt{2} \cdot B_1 \sin(\omega t) \qquad \text{Eqn. (9);}$$

where $B_1(t)$ is the continuous RF wave; $B_1$ is the amplitude of the continuous RF wave; $\omega$ is the first frequency, for which $-\omega$ is the second frequency; and t is time. This amplitude modulation generates a frequency response with components at both $+\omega$ and $-\omega$.

After the three image data sets described above are acquired, various images may be reconstructed from the respective data sets. As indicated by process block 306, a first frequency ("F1") image may be reconstructed from the first frequency image data. Reconstruction may include a conventional image reconstruction process; however, it will be appreciated by those skilled in the art that any number of image reconstruction methods can be employed. Similarly a second frequency ("F2") image may be reconstructed from the second frequency image data, as indicated by process block 308. Lastly, a dual frequency ("DF"), or an IHMT, image may be reconstructed from the dual frequency, image data, as indicated by process block 310.

Then, at process block 312, at least one desired image, such as IHMT images, may be generated by selectively combining various images reconstructed at process blocks 306-310. In some aspects, the desired image(s) may be representative of information associated with exchangeable magnetization from the inhomogeneously broadened bound pool protons. In one example, a desired image may include a difference or subtraction image as described with reference to Eqn. 1. It will be appreciated by those skilled in the art that a subtraction of acquired image data may be performed prior to image reconstruction to generate a difference or subtraction data. Such difference data may then be reconstructed to produce a difference or subtraction image, and would be functionally equivalent to subtracting the respective images after reconstruction.

In addition to acquiring three image data sets as described above, in some instances it may be advantageous to acquire a second dual frequency image data set, thereby acquiring four total image data sets. Also, other numbers of image data sets are contemplated. By way of example, when pulsed RF energy is used, it may be beneficial to acquire a first dual frequency image data set by alternating the frequency of the RF pulses between the first frequency (odd pulses) and the second frequency (even pulses). A second dual frequency image data set may then be acquired by alternating the frequency of the RF pulses between the first frequency (even pulses) and the second frequency (odd pulses). A first and second dual frequency image may then be reconstructed from these first and second dual frequency image data sets, respectively. The first and second dual frequency images may then be averaged together to obtain an average dual frequency image that is selectively combined with various labeled and reference images, or first and second frequency images F1 and F2. Also, as will be described, a preparation module at step 314 may optionally be used to create the reference image. To this end, the optional preparation module at step 314 may precede the acquisition of the first frequency image data at step 300 or at other suitable positions in the above-described process.

When the RF saturation pulses are alternated between the first and second frequencies, the last RF pulse has to be one or the other. The slight timing difference between the last first frequency pulse and the last second frequency pulse can result in a small, systematic error. Thus, by switching the manner in which the pulses are alternated between the first and second frequencies, and then averaging the two resultant dual frequency images, these small, systematic errors may be mitigated.

The herein described IHMT method allows for imaging of exchangeable magnetization of bound pool protons that is much more robust to variations in the water frequency caused by nonuniform magnetic fields than prior single reference techniques. However, in some applications, additional correction of water frequency offset effects may be desirable. In these instances, the IHMT method may be repeated with a different frequency offset being added to the first and second frequencies during each repetition. For example, a frequency offset of +0.5 ppm may be applied to both the first and second frequencies during a given repetition. By varying the frequency offset during each repetition, multiple first, second, and dual frequency image data sets may be obtained, from which a set of multiple first, second, and dual frequency images may be reconstructed. The information contained in these images can be used to correct for water frequency offsets by, for example, interpolating the information contained in each set of the reconstructed images to a larger set of data points and shifting the resulting interpolated data using a fined z-spectrum water frequency offset for each voxel location in the images. These shifted first, second, and dual frequency images that were acquired using the non-offset first and second frequencies are then selectively combined as described above to arrive at the desired images.

In some aspects, the herein described IHMT method can be repeated with a different frequency offset being added to the first and second frequencies during each repetition to acquire sets of multiple first, second, and dual frequency images. In this instance, the sign of the frequency offset as applied to the first frequency may be changed before applying to the second frequency. For example, if a frequency offset of +0.5 ppm is applied to the first frequency, then a frequency offset of −0.5 ppm is applied to the second frequency. Using the sets of multiple images acquired in this manner, various information associated with the exchangeable magnetization of bound pool protons can be obtained. Such information may include frequency information, in the form of a spectrum that can indicate a center frequency of the protons, which may vary with different biochemical species. The information may also indicate $T_2$ relaxation of the protons. The spectrum can also provide information about the chemical structures containing the inhomogeneously broadened protons, and may assist quantification of exchange rate and quantification.

In some aspects, the described IHMT method may repeated using different RF power levels during each repetition. By way of example, the different power levels may be achieved by changing the pulse repetition rate or pulse amplitude when pulsed RF saturation energy is used, or by changing the amplitude of the continuous wave RF energy when continuous wave RE energy is used. By varying the power level in subsequent acquisitions, images with different sensitivity to proton exchange rate and exchangeable magnetization concentration may be obtained. The exchange rate and exchangeable magnetization concentration measurable with the IHMT MRI reflect inhomogeneous magnetization transfer from a broad line. The images may also be subtracted or otherwise mathematically combined to produce images indicative of either exchangeable magnetization concentration or exchange rate without the need to calculate measured values.

As described, IHMT signals and as-measured $T_2$ are sensitive to errors in power from miscalibration or non-uniformity. However, as power is increased, the IHMT effect begins to saturate and the signal becomes much less sensitive to the power amplitude. Because RF power can vary across a sample or tissue of interest, due to RF coil geometry or electrical properties of tissue, reduced sensitivity to power amplitude is desirable. As such, reduced power sensitivity images will be more reflective of tissue properties and less reflective of equipment and calibration effect. Higher power saturation may not be possible for long durations because of safety limits on RF power deposited in patients or hardware limits on the average power of RF systems. Hence, the present disclosure recognizes that applying a shorter, high power preparation pulse sequence that achieves approximate saturation of the IHMT effect, may achieve the RF power insensitivity while remaining within the safety and equipment requirements. Because IHMT tends to increase proportional to power until near saturation, applying higher RF power for shorter duration but achieving comparable average RF power to a longer application of RF at lower power can provide a similar level of IHMT effect. Thus, in accordance with aspects of the present disclosure, power-insensitive IHMT imaging may be achieved using high power and a short duration. Such a power-insensitive IHMT imaging will be more reflective of myelin differences across the brain.

As described above, the present approach can generate measurements, or images, that isolate the effect of magnetization transfer of a particular targeted pool from the effects of other pools, tissue properties, or properties of imaging subjects or objects. This is particularly useful for the measurement of more subtle effects, such as chemical exchange saturation transfer or IHMT in the presence of the larger effects of magnetization transfer from broad macromolecules and tissue relaxation. Successful isolation of particular exchange effects can increase tissue contrast, quantitative accuracy, and potentially diagnostic accuracy of imaging.

Typically, the ratio of the signal difference between two experiments to the unsaturated image (i.e. MTR) can be used as a measure of the MT effect. However, the present disclosure recognizes that this is an imperfect measure because it mixes together direct saturation effects and different MT components in a nonlinear way. Though such data can he fit to a complex model, a simple analytic quantification with a minimal number of points is more desirable. Thus, in accordance with the present disclosure, an alternative formulation may be used to facilitate quantification of MT phenomena.

More particularly, as explained above, MT may involve one or more pools in exchange with the visible, free pool. As long as the RF is not sufficiently powerful and on-resonance to rotate the transverse magnetization beyond a small angle from the z-direction, the Bloch equations for each MT component can be reduced to:

$$\frac{\delta M_B}{\delta t} = (M_B^0 - M_B)R_B - R(M_A^0 M_B - M_B^0 M_A) - R_B^{rf} M_B; \quad \text{Eqn. (10)}$$

Where B is the bound pool, A is the visible pool, and the saturation effect of RF power is given by:

$$R_B^{rf} = \omega_1^2 \pi g_B(2\pi\Delta) \quad \text{Eqn. (11);}$$

with g a function, such as Lorentzian, Gaussian or Super Lorentzian. For example, Lorentzian being:

$$R_B^{rf} = \frac{\omega_1^2 T_2}{1 + (2\pi\Delta T_2)^2}; \quad \text{Eqn. (12)}$$

with $T_2$ potentially affected by the exchange rate. If a steady state is assumed and it is assumed that exchange and saturation dominate relaxation, such that $(R_B^{rf} + RM_A^0) \gg R_B$, then a simple steady state occurs, such that:

$$M_B = \frac{RM_B^0 M_A}{RM_A^0 + R_B^{rf}}. \quad \text{Eqn. (13)}$$

Assuming many such components and substituting in the equation for the steady state visible magnetization gives:

$$M_A = \frac{M_A^0 R_A}{\left(R_A + RM_B^0 + R_A^{rf} - \frac{RM_B^0}{1 + \frac{R_B^{rf}}{M_A^0 R}}\right)} = \frac{M_A^0 R_A}{\left(R_A + R_A^{rf} + \frac{R_B^{rf} RM_B^0}{M_A^0 R + R_B^{rf}}\right)} \quad \text{Eqn. (14)}$$

Note, if there are more than one MT components (MB) but they all meet the criterion for exchange dominance, they add to provide:

$$M_A = \frac{M_A^0 R_A}{\left(R_A + R_A^{rf} + \sum_i \frac{R_i^{rf} R_{Ai} M_i^0}{M_A^0 R_{Ai} + R_i^{rf}}\right)}; \quad \text{Eqn. (15)}$$

individual exchange rates are defined Ai.

Examples of multiple components may include Chemical Exchange Saturation Transfer ("CEST") (Ward et al. Journal of Magnetic Resonance. 2000 143:79-87.) or IHMT. If the conventional MT ratio is used the equation takes the form:

$$MTR = 1 - \frac{M_A}{M_A^0} = \frac{R_A^{rf} + \sum_i \frac{R_i^{rf} R_{Ai} M_i^0}{M_A^0 R_{Ai} + R_i^{rf}}}{\left(R_A + R_A^{rf} + \sum_i \frac{R_i^{rf} R_{Ai} M_i^0}{M_A^0 R_{Ai} + R_i^{rf}}\right)}; \quad \text{Eqn. (16)}$$

And the result mixes all components together in nonlinear fashion. However, if the alternate expression is used the equation takes the form:

$$R1 ratio = \frac{M_A^0}{M_A} - 1 = \frac{R_A^{rf} + \sum_i \frac{R_i^{rf} R_{Ai} M_i^0}{M_A^0 R_{Ai} + R_i^{rf}}}{R_A}; \quad \text{Eqn. (17)}$$

and then the expression is linear in the exchange components. Differences between two experiments where one component of MT (and direct saturation) is fixed, such as positive vs. dual frequency in an IHMT experiment or positive and negative frequency in a CEST experiment where conventional MT is relatively unchanged, will become insensitive to the unchanging components. Only the original R1 is needed for quantification.

To a large extent, the steady state approach to MT with a low flip angle gradient echo imaging sequence and RF saturation pulses before each excitation, can be approximated as a steady state with a different R1 and M0 then equilibrium. The signal from a steady state sequence is given by:

$$S = M_0 \frac{\sin\alpha(1 - e^{-R_1 T_r})}{(1 - \cos\alpha e^{-R_1 T_r})}. \quad \text{Eqn. (18)}$$

For R1 TR<<1 and α<<1, this becomes:

$$S = M_0 \frac{\alpha R_1 T_r}{\left(R_1 T_r + \frac{\alpha^2}{2}\right)}. \quad \text{Eqn. (19)}$$

If power is applied, the M and R1 change gives:

$$M_0^* = \frac{M_0 R_1}{R_1^*}; \quad \text{Eqn. (20)}$$

$$S^* = M_0 R_1 T_r \frac{\alpha}{\left(R_1^* T_r + \frac{\alpha^2}{2}\right)}. \quad \text{Eqn. (21)}$$

Note that calculating MT differences using the inverse of S preserves the linearity in R1 that is an advantage of the true steady state:

$$S\Delta\left(\frac{1}{S^*}\right) = \frac{\Delta(R_1^*)T_r}{\left(R_1 T_r + \frac{\alpha^2}{2}\right)}. \quad \text{Eqn. (22)}$$

This expression does produce a flip angle dependent result, however. There are two sources of RF field ($B_1$)

sensitivity, however, to this expression. The flip angle and the difference in $R_1$. For many situations, the change in $R_1$ dependence is proportional to power. In this case, a reference image can be acquired with the flip angle increased by a factor of C, such that the right, flip angle dependent term in the denominator is much larger than the term on the right:

$$\frac{S_C}{C}\Delta\left(\frac{1}{S^*}\right) = \frac{\Delta(R_1^*)T_r}{\left(R_1T_r + \frac{C^2\alpha^2}{2}\right)}. \qquad \text{Eqn. (23)}$$

In one example, a factor of 2 or 3 may largely remove $B_1$ sensitivity. This has the other advantage that the result becomes independent of $R_1$. On the other hand, if the change in R1 is saturated (i.e. independent of $B_1$) as can occur for a slowly exchanging CEST line on resonance, then C should be set substantially less than one.

While this strategy naturally lends itself to steady state gradient echo sequences, the same approach can be used for a long, steady state preparation of a fast readout sequence, such as EPI or RARE. In this case, the readout is eliminated but the option for a low flip angle, RF spoiled RF pulse on resonance is preserved. The sin alpha term now vanishes. A zero flip can then be used for the MT preparation sequences. For the reference image, a nonzero flip angle such that 1-cos(alpha) is much greater that R1Tr is used.

Thus, as described above, in the steady state, linearity can be achieved by subtracting the inverse of the magnetization measured under different irradiation. This is particularly useful for studies of more subtle differences in magnetization after irradiation with different powers or frequency distributions, as is used for CEST or for multi-frequency irradiation, such as described above.

That is, as explained, measurement of magnetization transfer includes the comparison of two or more images with different off-resonance irradiation. Conventionally this comparison is performed by subtraction of images. The problem with this approach is that images acquired with saturation are not linearly dependent on magnetization transfer. This nonlinearity mixes together magnetization transfer effects with direct saturation and relaxation effects. It is even more of a problem when trying to identify a smaller component of MT (such as inhomogeneous MT or CEST) in the presence of a larger, undesired MT contribution. If subtraction is used, the more subtle effect of IHMT or CEST will be modulated by the undesired MT contribution.

As described above, subtracting the inverse of the signals from images acquired with different off-resonance saturation can provide an almost complete separation of the desired MT components from other MT components. In the case of IHMT, one can calculate:

$$IHMTR_1 = S_{ref}\left(\frac{2}{S_{dual}} - \frac{1}{S_{pos}} - \frac{1}{S_{neg}}\right); \qquad \text{Eqn. (24)}$$

where the subscripts are "pos" for positive offset single frequency saturation, "neg" for negative offset single frequency saturation, "dual" for dual frequency saturation, and "ref" for a reference image, typically one without any off-resonance saturation. This provides separation of the IHMT effect from other MT components whereas the more traditional relationship, $$IHMTR = \left(\frac{S_{pos} + S_{neg} - 2S_{dual}}{S_{ref}}\right),$$

provides a measure that, while still zero if there is no IHMT, it is nonlinearly dependent on other parameters, especially conventional broad macromolecular MT. However, as shown above, for steady state gradient echo pulsed MT, this inverse subtraction is similarly desirable for steady state gradient echo pulse sequences.

Even with the separation of the desired MT component from other MT components by inverse subtraction, the measured MT component is dependent upon the relaxation rate in the tissue (referred to as $R_1$ or $1/T_1$) and any errors in the applied off-resonance RF magnetic field. These can occur either because the RF is miscalibrated or because the distribution of RF field is spatially nonuniform, because of imperfections in the hardware used to create the RF field (typically referred to as an RF coil) and/or because the dielectric properties of tissue distort the RF field.

In a steady state gradient echo MT experiment using inverse subtraction, as described above, choosing a higher flip angle for the reference image example 40 degrees instead of the 10 degrees used for the MT image acquisition) created an image that became independent of $R_1$ and the applied RF magnetic field strength. An extension of this approach could also be used if a prepared sequence is instead employed. In preparation, the RF can be applied to create a certain magnetization and then the image is rapidly sampled in a way that the image intensity is proportional the magnetization just before the image acquisition. An appropriate $T_1$ weighted reference image can be created by applying repeated RF pulses on resonance, just like the excitation pulses of a steady state gradient echo sequence.

Thus, it is herein recognized that when low flip angle steady state sequences are employed, the RF field and tissue $T_1$ sensitivity of the measurement can be greatly reduced by acquiring a reference image, without RF, at a different flip angle. For MT saturation that is dependent upon power, as occurs in transfer from broad lines, from inhomogeneous lines or from sufficiently rapidly exchanging CEST lines, the use of a reference image with substantially larger flip angle can substantially eliminate RF and $T_1$ dependence of the measurement.

It is further recognized that the benefits of RF field and tissue $T_1$ insensitivity can also be obtained when using RF irradiation as a prepared sequence. A preparation of off-resonance saturation pulses and weaker on resonance, spoiled RF pulses, but without imaging readout, will achieve the same effect as a preparation for a readout sequence such as EPI, RARE, or other such sequences. In fact, the flip angle during the MT preparation can be set to zero and then increased to a larger value, 30-40 degrees, for the reference scan.

Despite these efforts to control the RF power applied, it can be challenging to leverage all of the capabilities of IHMT MRI with humans, while still staying below the RF heating safety limits, IHMT and MT techniques, as described above, typically employ RF irradiation spread out over time with duty cycles of 50% or more, such as described above with respect to FIG. 2. To overcome this challenge, in some aspects, a "concentrated" or non-distributed pulse cycle that presents a lower duty cycle may be utilized, as described below.

Figure 4A:
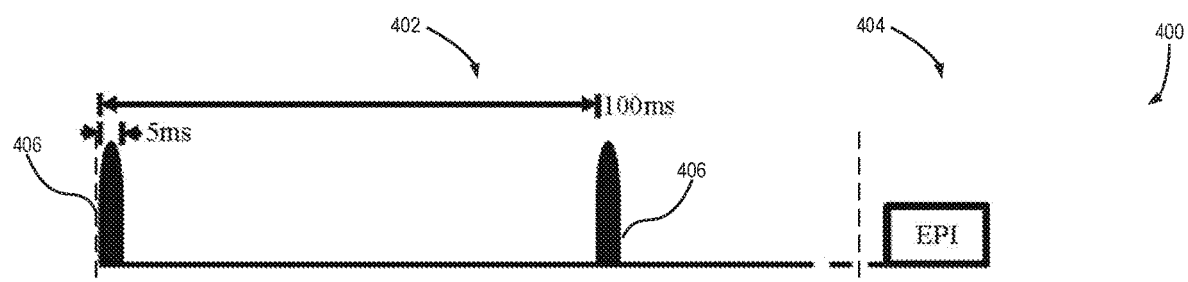
FIG. 4A is a pulse sequence diagram illustrating an IHMT pulse sequence including a preparation module with an off-resonance power applied in a concentrated or non-distributed pulse cycle in accordance with the present disclosure.

Referring now to FIG. 4A, an example pulse sequence 400, in accordance with the present disclosure, is illustrated.

The pulse sequence 400 includes a preparation module 402 with a concentrated pulse cycle and an imaging module 404. As shown, the preparation module 402 includes only a few, sparsely distributed RF saturation pulses 406, in contrast to the preparation module 202 described with reference to FIG. 2. In some aspects, the preparation module 402 may have a concentrated pulse cycle, while maintaining an overall $B_1$ field that is similar for $B_1$ RMS. Preferably, the preparation module 402 may have a duty cycle of less than approximately 50%, although other values may be possible.

In the non-limiting example illustrated in FIG. 4, the RF saturation pulses 406 are shown to be approximately 5 ms in duration and separated by a substantial repetition time, about 100 ms. As such, the preparation module 402 has approximately a 5% duty cycle. Other duty cycles less than 50% may be advantageous. However, to maintain an overall $B_1$ field that is similar to $B_{1,RMS}$ associated with the preparation module 202 of FIG. 2, the amplitude of each RF saturation pulse may be increased. In the non-limiting example illustrated in FIG. 4, the amplitude of the RF saturation pulses 406 may be approximately 3 times larger as compared to those in the preparation module 202 of FIG. 2.

Regardless of the specific duly cycle or amplitude of the RF pulses, if the preparation module 202 of FIG. 2 represents a desired $B_{1,RMS}$, the preparation module 402 of FIG. 4A can be designed with a concentrated pulse cycle and an amplitude and/or duration of each RF pulse 406, 408 that achieves a $B_{1,RMS}$ as that is identical or substantially similar (e.g., +/−10%) to the desired $B_{1,RMS}$. Thus, counterintuitively, a concentrated pulse cycle that uses less-frequent, higher $B_1$ pulses, can deliver the same average power over the saturation period as a "distributed" pulse cycle. While providing advantages with respect to SAR and RF heating safety limits.

Figure 4B:
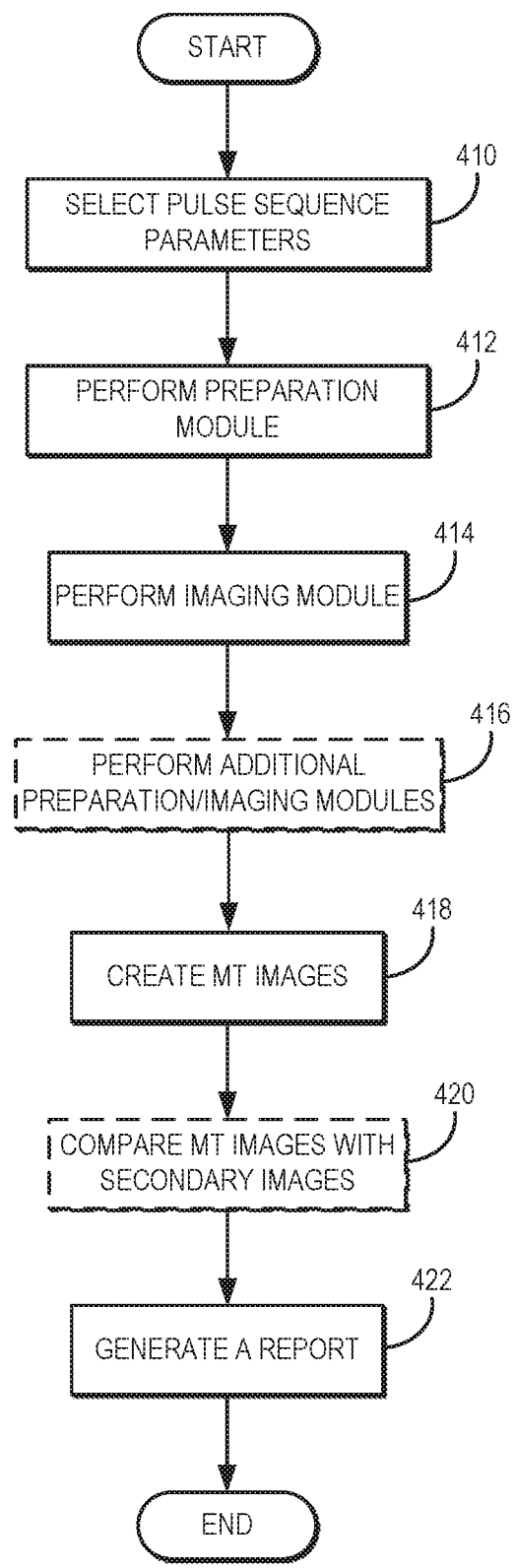
FIG. 4B is a flow chart setting forth the steps of an exemplary method for performing IHMT imaging using a concentrated duty cycle in accordance with the present disclosure.

Referring now to FIG. 4B, a flow chart setting forth the steps of a process, in accordance with aspects of the present disclosure, is shown. In some aspects, the process may be carried out using a MRI system, as described with reference to FIG. 7, to perform myelin specific imaging using inhomogeneous magnetization transfer ("IHMT").

The process may begin at process block 410 by selecting parameters associated with a desired imaging pulse sequence that includes a preparation module and imaging module, as described. For example, as explained above, selected parameters may be indicative of the imaging module to be used (e.g., EPI, GRE, SPGR, etc.). In some aspects, selected parameters may indicate whether a distributed or concentrated pulse cycle is to be used in the preparation module.

Then, at process block 412, a preparation module may be performed, followed by an imaging module at process block 414, as shown. In one example, process blocks 412 and 414 may represent performance of the preparation module 402 and imaging module 404 described with reference to FIG. 4A. That is, process blocks 412 and 414 may be performed using a concentrated pulse cycle. As such, the preparation module 402 may include a number of RF saturation pulses performed with a duty cycle that is less than 50%, and preferably less than 5%, although other values may be possible. As described above, in some aspects, pulse amplitudes and/or durations of RF saturation pulses in the preparation module may be configured to achieve the desired pulse cycle and enhance power efficiency, while safe tissue heating levels. In some aspects, the RF saturation pulses may be configured to achieve a $B_{1,RMS}$ that is identical or substantially similar (e.g., +/−10%) to a desired $B_{1,RMS}$. In some aspects, the desired $B_{1,RMS}$ is comparable to that of a distributed pulse cycle.

Image data acquired following the performance of the imaging module at process block 414 may then be used to create one or more images, such as magnetization transfer ("MT") images, in accordance with the present disclosure. In some aspects, acquired imaging data may be analyzed to generate frequency information, or spectra, and other information derived therefrom. In particular, in some aspects, the imaging data may be analyzed to identify various inhomogeneous lines, which are formed by a summation of multiple sublines centered at multiple different frequencies, as described.

In some implementations, process blocks 416 and 420 may be optionally included in the above-described process, as shown in FIG. 49. In particular, at optional process block 416, additional preparation/imaging module combinations may be performed. Then, at process block 418 various MT images, and other images that benefit from enhanced power efficiency, may be generated such that, at optional process block 420, a comparison can be made. By way of example, MT images may be created following process blocks 416 and 418, by using different irradiation distributions in the preparation modules, such as RF saturation pulses played out higher duty cycles. Then, the comparison at process block 420 may be performed to characterize those components of the MT signal that reflect more nonlinear response with power, either because of dipolar order or slower exchange.

A report, in any form, may then be generated, as indicated by process block 422. The report may be in the form of images, or information obtained from images or image data. In some aspects, the report may pertain to homogenous or inhomogeneous magnetization transfer occurring in the subject in response to the applied preparation module, and more particularly based on the inhomogeneous lines identified.

To test for timing effect, images acquired with the sparse pulses were shifted in time by increments of 10 ms to avoid any timing/relaxation effects. These effects appeared small. The experiments were performed with both single frequency pulses and dual frequency (by cosine modulation) pulses. Substantial differences between distributed and concentrated or "sparse" irradiation at the same average power levels were observed in humans and in hair conditioner phantoms. Single frequency irradiation showed a much greater difference than dual frequency irradiation, consistent with the power limiting effect of dipolar order contributing to IHMT. Surprisingly, IHMT calculated from the sparse irradiation data were approximately 3× greater than the distributed irradiation data, indicating a 3 fold increase of IHMT for the same applied power level. Subtracting either single or dual frequency distributed data from their sparse counterparts created images emphasizing myelinated tissues, though both showed indications of effects in scalp suggesting reduced specificity to white matter. The specificity was better at lower power, suggesting that the comparison of sparse to distributed saturation at lower average powers could be a potential alternative to single vs. dual frequency irradiation to highlight white matter.

A comparison of pulsed MT results showed that subtraction images using distributed and sparse single frequency irradiation can give the highest signal, but showed signal in the scalp, suggesting reduced myelin specificity. IHMT subtraction images calculated using just the sparse data produced a slightly lower signal, but much better specificity. IHMT imaged from the distributed data, showed much lower signal for the same power, indicating that the sparse saturation performs very favorably in power limited applications, such as imaging of humans.

Nonlinear saturation effects with power within myelinated and other tissues can be highlighted with sparse saturation schemes at high instantaneous power. Such sparse approaches can be used to amplify IHMT signal relative to power constrained distributed saturation and may also provide an approach to characterize nonlinear saturation in different MT contributors.

Thus, the present approach demonstrates the feasibility of concentrated pulse cycle formed using short bursts of higher power MT irradiation, either on their own to enhance the power efficiency of IHMT MRI, or in comparison with more evenly distributed irradiation, to characterize those components of the MT signal that reflect more nonlinear response with power, either because of dipolar order or slower exchange. As appreciated from description herein, this approach can provide increased SNR and decreased SAR.

As a non-limiting example, an experiment was performed to investigate the use of concentrated (lower duty cycle) high power pulses during saturation preparation to achieve an increase of the IHMT signal in vivo. As described above, IHMT imaging shows promise for characterization of myelinated tissues, but the signal difference it measures is relatively small, especially at powers achievable in humans. As described above, IHMT and MT typically employ RF irradiation spread out over time with duty cycles of 50% or more. In this study, the duty cycle change was compared by taking an initial 50% duty cycle, i.e. distributed pulse cycle, and, for the same average power over the saturation period, the concentrated case of less frequent, higher B1 pulses.

The experiments for IHMT data (i.e. saturation at single, and dual offset frequencies) were conducted on 3 healthy volunteers using a 3T scanner and 8-channel head coil. The preparation module was performed using 5 ms pulses (cosine modulated for dual offset frequency irradiation) for a saturation duration of 2 s, prior to single shot spin echo EPI (FOV=25×25 cm2; matrix=128×128; slice=6 mm; TE/TR=24 ms/5 s). To create a distributed pulse cycle in the preparation module, 5 ms pulses were initially applied every 10 ms for a 50% duty cycle, such as illustrated in FIG. 2. For the preparation module employing the concentrated pulse cycle, the space between pulses was increased while maintaining $B_{1,RMS}$. In particular, as illustrated in FIG. 4A, the duty cycle was reduced relative to the distributed pulse cycle of FIG. 2 to a duty cycle of 5%.

To analyze the effect of duty cycle, absolute offset frequency, $|\Delta|$ and $B_{1,RMS}$ over the duration of the preparation module was explored. Specifically, the effect of this reduction in duty cycle on the IHMT ratio (ITMTR) was examined for a range of $|\Delta|$ and $B_{1,RMS}$ values. Also, the MT ratio (MTR) difference was calculated between the saturated signals for duty cycles <50% and 50%, such that MTR difference=MTR(50% duty cycle)−MTR(<50% duty cycle).

Figure 5A:
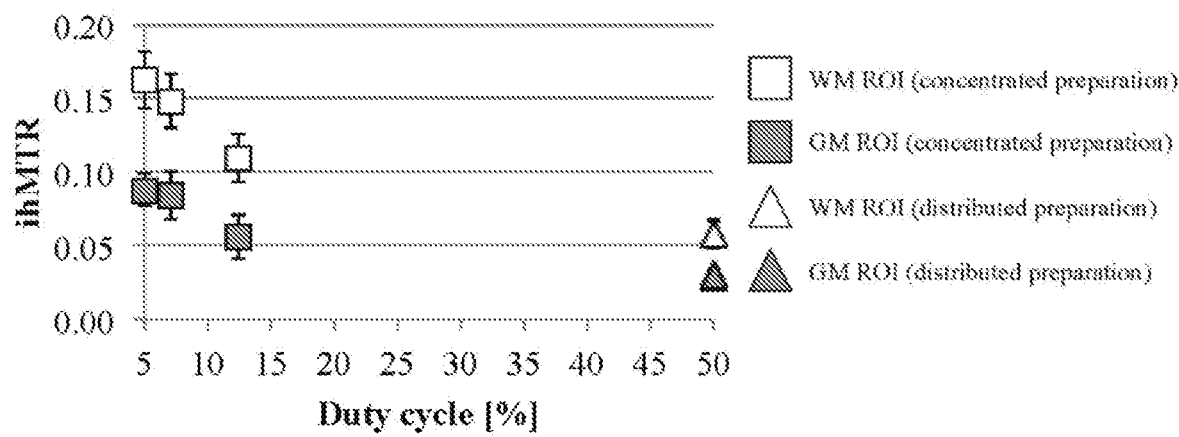
FIG. 5A is a graph of IHMTR as a function of duty cycle in accordance with the present disclosure.
Figure 5B:
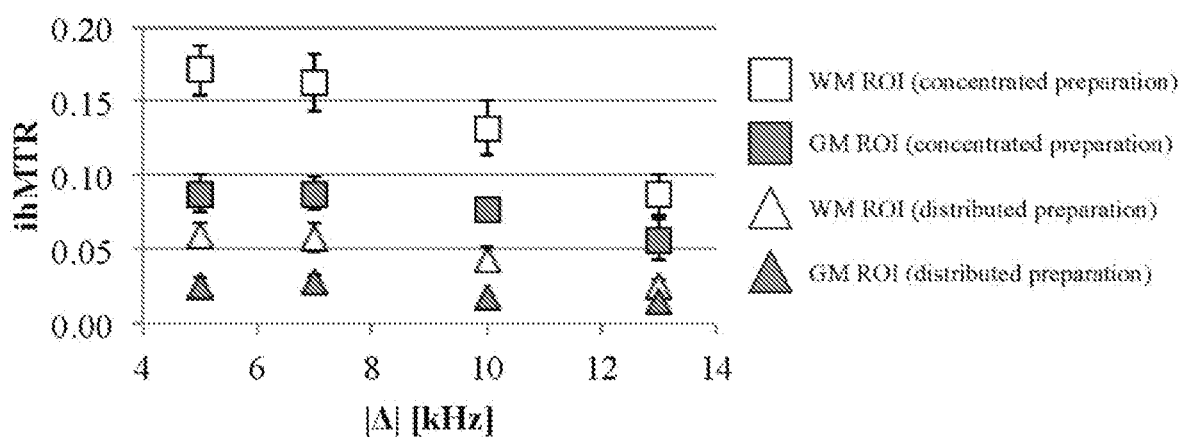
FIG. 5B is a graph of IHMTR as a function of absolute frequency offset in accordance with the present disclosure.
Figure 5C:
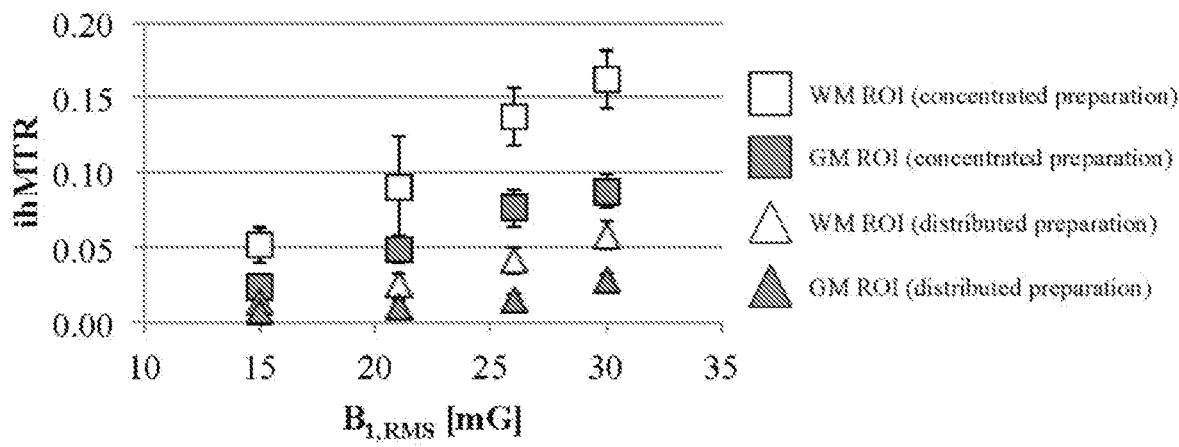
FIG. 5C is a graph of IHMTR as a function of $B_{I,RMS}$ as calculated over the saturation preparation duration in accordance with the present disclosure.

There were 2 to 5 fold increases in the IHMTR using the concentrated pulse cycle versus the distributed pulse cycle preparation (i.e. data acquired at a lower duty cycle) from white matter (WM) and grey matter (GM) ROIs. These results are illustrated in FIG. 5A-5C, which provide plots of IHMTR as functions of duty cycle (FIG. 5A), absolute frequency offset of off-resonance saturation $|\Delta|$ (FIG. 5B), and $B_{1,RMS}$ as calculated over the saturation preparation duration (FIG. 5C).

Figure 6A:
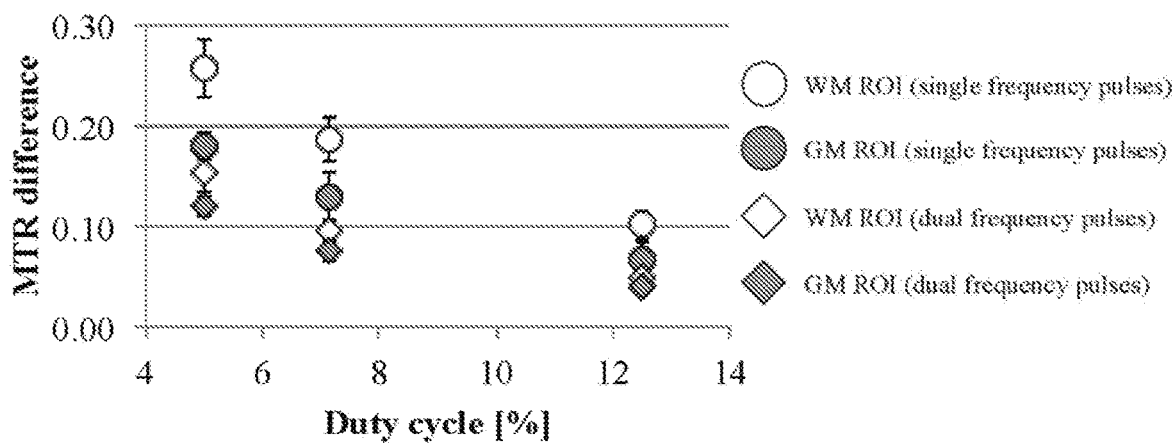
FIG. 6A is a graph of MTR difference between normalized signals following <50% duty cycle preparation and 50% duty cycle preparation as a function of duty cycle.
Figure 6B:
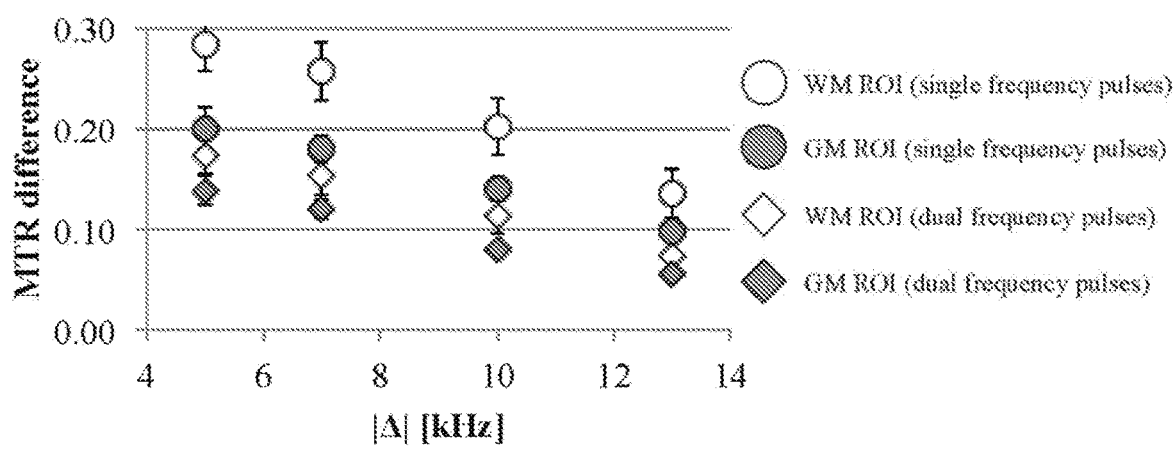
FIG. 6B is a graph of MTR difference between normalized signals following <50% duty cycle preparation and 50% duty cycle preparation as a function of absolute frequency offset of off-resonance saturation |Δ|.
Figure 6C:
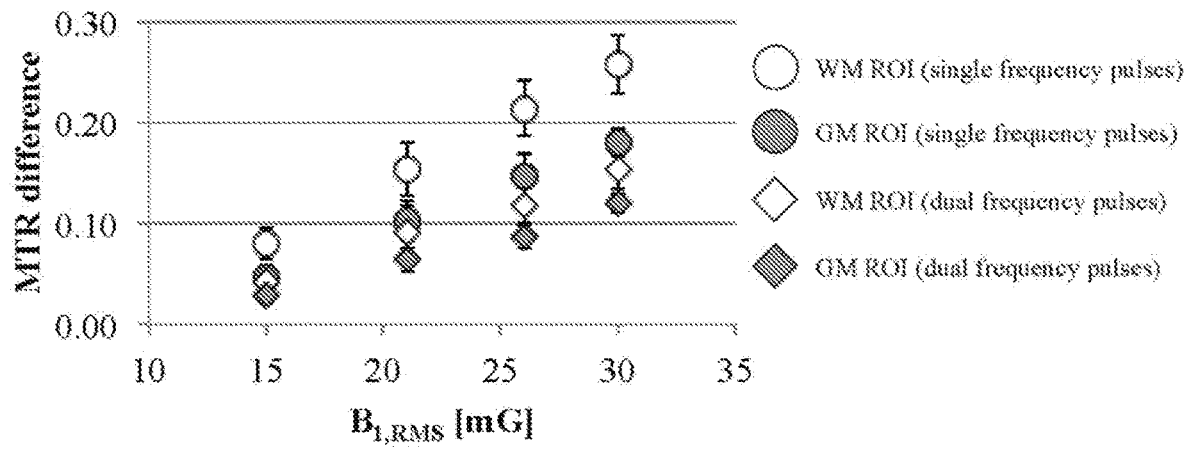
FIG. 6C is a graph of MTR difference between normalized signals following <50% duty cycle preparation and 50% duty cycle preparation as a function of $B_{I,RMS}$ is as calculated over the saturation preparation duration.

The IHMTR spectrum was similar in shape but somewhat changed by a concentrated preparation; IHMTR at higher frequency was amplified more by the concentrated irradiation than at lower $|\Delta|$. Examining individual components of the calculated IHMTR, the MTR was greatly reduced for concentrated single frequency irradiation and substantially less so for the dual frequency concentrated case. For example, as illustrated in the graphs provided in FIGS. 6A-6C, the MTR difference between normalized signals following <50% duty cycle preparation and 50% duty cycle preparation is provided as functions of duty cycle (FIG. 6A), absolute frequency offset of off-resonance saturation A (FIG. 6B), and $B_{1,RMS}$ as calculated over the saturation preparation duration (FIG. 6C). Based on the MTR difference, the WM/GM ratio in resulting images increased from 1.3±0.1 to 1.5±0.1 going from single frequency to dual frequency data, and for lower $B_{1,RMS}$ with a ratio of 1.8±0.4 at $B_{1,RMS}$=15 mG.

Therefore, this example demonstrates that use of shorter duration, high power saturation pulses during preparation at similar or equal $B_{1,RMS}$ (i.e. lower duty cycles) to that desired using a distributed pulse cycle increased the IHMTR achievable and provided a means to reduce the average SAR. In fact, the present approach can be used to provide the ability to greatly increase the IHMT signal within safe power levels, even at field strengths of 3 T, which enhances the diagnostic and scientific potential of IHMT.

Some studies of the IHMT have demonstrated sensitivity to the dipolar relaxation time, $T_{1D}$ parameter. Since dipolar order effects and $T_{1D}$ only affect single frequency irradiation, the greater reduction of concentrated single frequency irradiation suggests additional $T_{1D}$ sensitivity. The MTR difference between concentrated and distributed single frequency preparation modules presents an alternative IHMT-like contrast when power constraints are substantial, such as at 7 T and above. Indeed, an example volunteer image of the IHMTR (5% duty cycle; $B_{1,RMS}$=30 mG) and MTR difference from data acquired at the lowest $B_{1,RMS}$ shows comparable contrast.

Figure 7:
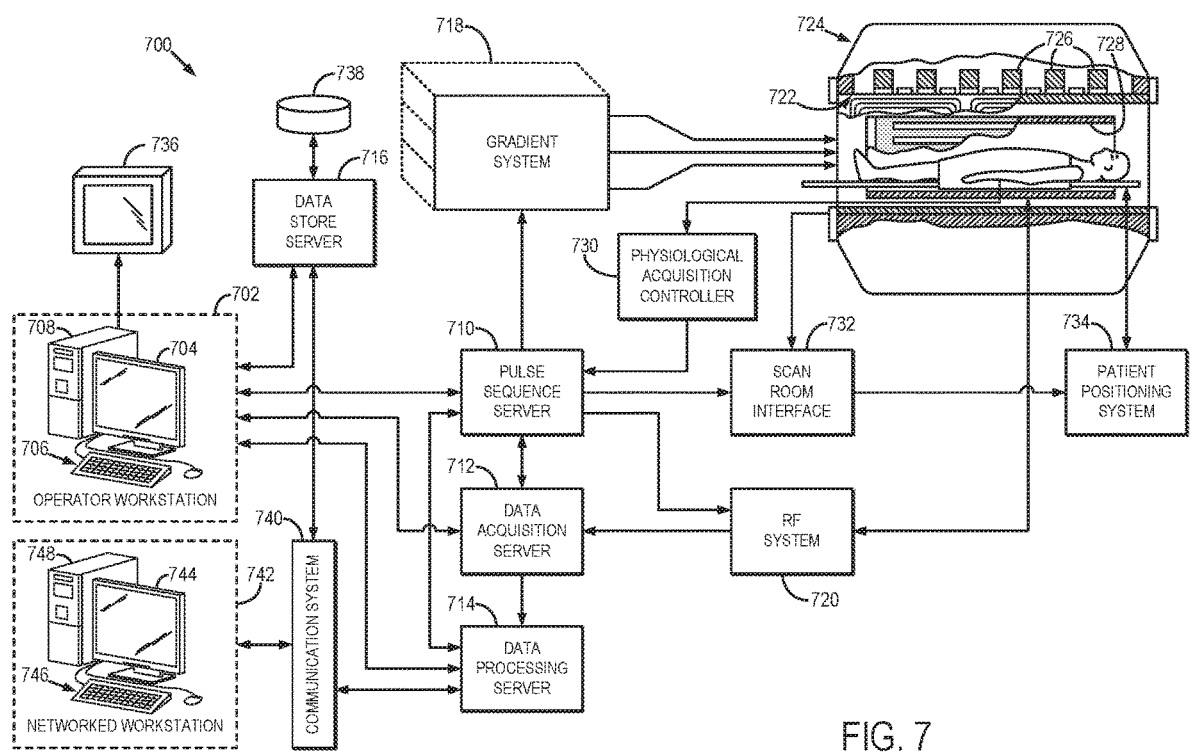
FIG. 7 is a block diagram of an exemplary magnetic resonance imaging ("MRI") system that employs the present invention.

Referring particularly now to FIG. 7, an example of a magnetic resonance imaging ("MRI") system 700 that may be used to implement the systems and methods of the present disclosure is illustrated. The MRI system 700 includes a workstation 702 having a display 704 and a keyboard 706. The workstation 702 includes a processor 708, such as a commercially available programmable machine running a commercially available operating system. The workstation 702 provides the operator interface that enables scan prescriptions to be entered into the MRI system 700. The workstation 702 is coupled to servers, including a pulse sequence server 710, a data acquisition server 712, a data processing server 714, and a data store server 716. The workstation 702 and each server 710, 712, 714, and 716 are in communication.

The pulse sequence server 710 functions in response to instructions downloaded from the workstation 702 to operate a gradient system 718 and a radiofrequency ("RF") system 720. Gradient waveforms necessary to perform the prescribed scan are produced and applied to the gradient system 718, which excites gradient coils in an assembly 722 to produce the magnetic field gradients $G_x$, $G_y$, and $G_x$ used for position encoding MR signals. The gradient coil assembly 722 forms part of a magnet assembly 724 that includes a polarizing magnet 726 and a whole-body RF coil 728.

RF excitation waveforms are applied to the RF coil 728, or a separate local coil (not shown in FIG. 7), by the RF system 720 to perform the prescribed magnetic resonance pulse sequence. Responsive MR signals detected by the RF coil 728, or a separate local coil, are received by the RF system 720, amplified, demodulated, filtered, and digitized under direction of commands produced by the pulse sequence server 710. The RF system 720 includes an RF transmitter for producing a wide variety of RF pulses used in MR pulse sequences. The RF transmitter is responsive to the scan prescription and direction from the pulse sequence server 710 to produce RF pulses of the desired frequency, phase, and pulse amplitude waveform. The generated RF pulses may be applied to the whole body RF coil 728 or to one or more local coils or coil arrays.

The RF system 720 also includes one or more RF receiver channels. Each RF receiver channel includes an RF preamplifier that amplifies the MR signal received by the coil 728 to which it is connected, and a detector that detects and digitizes the I and Q quadrature components of the received MR signal. The magnitude of the received MR signal may thus be determined at any sampled point by the square root of the sum of the squares of the I and Q components:

$$M=\sqrt{I^2+Q^2} \qquad (25);$$

and the phase of the received MR signal may also be determined:

$$\varphi = \tan^{-1}\left(\frac{Q}{I}\right). \qquad (26)$$

The pulse sequence server 710 also optionally receives patient data from a physiological acquisition controller 730. The controller 730 receives signals from a number of different sensors connected to the patient, such as electrocardiograph ("ECG") signals from electrodes, or respiratory signals from a bellows or other respiratory monitoring device. Such signals are typically used by the pulse sequence server 710 to synchronize, or "gate," the performance of the scan with the subject's heart beat or respiration.

The pulse sequence server 710 also connects to a scan room interface circuit 732 that receives signals from various sensors associated with the condition of the patient and the magnet system. It is also through the scan room interface circuit 732 that a patient positioning system 734 receives commands to move the patient to desired positions during the scan.

The digitized MR signal samples produced by the RF system 720 are received by the data acquisition server 712. The data acquisition server 712 operates in response to instructions downloaded from the workstation 702 to receive the real-time MR data and provide buffer storage, such that no data is lost by data overrun. In some scans, the data acquisition server 712 does little more than pass the acquired MR data to the data processor server 714. However, in scans that require information derived from acquired MR data to control the further performance of the scan, the data acquisition server 712 is programmed to produce such information and convey it to the pulse sequence server 710. For example, during prescans, MR data is acquired and used to calibrate the pulse sequence performed by the pulse sequence server 710. Also, navigator signals may be acquired during a scan and used to adjust the operating parameters of the RF system 720 or the gradient system 718, or to control the view order in which k-space is sampled. In all these examples, the data acquisition server 712 acquires MR data and processes it in real-time to produce information that is used to control the scan.

The data processing server 714 receives MR data from the data acquisition server 712 and processes it in accordance with instructions downloaded from the workstation 702. Such processing may include, for example: Fourier transformation of raw k-space MR data to produce two or three-dimensional images; the application of filters to a reconstructed image; the performance of a backprojection image reconstruction of acquired MR data; the generation of functional MR images; and the calculation of motion or flow images.

Images reconstructed by the data processing server 714 are conveyed back to the workstation 702 where they are stored. Real-time images are stored in a data base memory cache, from which they may be output to operator display 712 or a display 736 that is located near the magnet assembly 724 for use by attending physicians. Batch mode images or selected real time images are stored in a host database on disc storage 738. When such images have been reconstructed and transferred to storage, the data processing server 714 notifies the data store server 716 on the workstation 702.

The MRI system 700 may also include one or more networked workstations 742. By way of example, a networked workstation 742 may include a display 744, one or more input devices 746 (such as a keyboard and mouse or the like), and a processor 748. The networked workstation 742 may be located within the same facility as the operator workstation 702, or in a different facility, such as a different healthcare institution or clinic. The networked workstation 742 may include a mobile device, including phones or tablets.

The networked workstation 742, whether within the same facility or in a different facility as the operator workstation 702, may gain remote access to the data processing server 714 or data store server 716 via the communication system 740. Accordingly, multiple networked workstations 742 may have access to the data processing server 714 and the data store server 716. In this manner, magnetic resonance data, reconstructed images, or other data may exchanged between the data processing server 714 or the data store server 716 and the networked workstations 742, such that the data or images may be remotely processed by a networked workstation 742. This data may be exchanged in any suitable format, such as in accordance with the transmission control protocol ("TCP"), the internet protocol ("IP"), or other known or suitable protocols.

As used herein, terms such as "approximately," "around," "about," and other synonyms, in relation to stated numerical values may include variations as understood by one of ordinary skill in the art. In some aspects, such variation may be negative (less than a nominal value) or positive (more than a nominal value), and up to 100%, or more, of the stated nominal value(s).

The present invention has been described in terms of one or more preferred embodiments, and it should be appreciated that many equivalents, alternatives, variations, and modifications, aside from those expressly stated, are possible and within the scope of the invention.

We claim:

1. A magnetic resonance imaging (MRI) system comprising:
   a magnet system configured to generate a polarizing magnetic field about at least a region of interest (ROI) of a subject arranged in the MRI system;
   a plurality of gradient coils configured to apply a gradient field with respect to the polarizing magnetic field;
   a radio frequency (RF) system configured to apply RF excitation fields to the subject and acquire MR image data therefrom; and a computer programmed to:
control the plurality of gradient coils and RF system to perform at least one pulse sequence that includes a preparation module followed by an imaging module, wherein the preparation module comprises a plurality of radio frequency (RF) saturation pulses applied according to a concentrated pulse cycle formed of RF pulses that are distributed non-uniformly during the preparation module to manipulate exchangeable magnetization from protons in the subject at an increased rate over RF pulses that are distributed uniformly during the preparation module with the same $B1_{,RMS}$, and the imaging module is configured to acquire image data; and
analyze the image data acquired to generate frequency information indicative of the exchangeable magnetization from protons in the subject;
generate a report, using the frequency information, pertaining to inhomogeneous or homogeneous magnetization transfer occurring in the subject.

2. The system of claim 1, wherein the increase is at least a 2 fold increase over RF pulses that are distributed uniformly during the preparation module with the same $B1_{,RMS}$.

3. The system of claim 2, wherein the concentrated pulse cycle includes a duty cycle of less than approximately 50 percent.

4. The system of claim 3, wherein the duty cycle is approximately 5 percent.

5. The system of claim 2, wherein the computer is further programmed to select parameters for the RF saturation pulses and the concentrated pulse cycle to achieve a $B_{1,RMS}$ comparable to a distributed RF pulse cycle.

6. The system of claim 2, wherein the computer is further programmed to generate magnetization transfer information used to form at least one set of magnetization transfer images.

7. The system of claim 6 wherein the computer is further programmed to compare the at least one set of magnetization transfer images with a second set of images acquired using RF pulses having at least one of magnitudes or pulse timing patterns that differ from the plurality of RF pulses of the preparation module.

8. The system of claim 7 wherein the computer is further programmed generate the report pertaining to homogenous or inhomogeneous magnetization transfer occurring in the subject based on the comparison.

9. The system of claim 1, wherein the increase is between a 2 fold and a 5 fold increase over RF pulses that are distributed uniformly during the preparation module with the same $B1_{,RMS}$.

10. A method for producing a report about a subject from data collected from the subject using a magnetic resonance imaging (MM) system, the method including steps comprising:
a) directing the MM system to perform at least one pulse sequence that includes performing a preparation module and an imaging module, wherein the preparation module includes applying a plurality of radio frequency (RF) pulses at least at one frequency and with a concentrated pulse cycle to manipulate exchangeable magnetization from protons in the subject to achieve at least a 2 fold increase over RF pulse that are distributed uniformly during the preparation module with the same $B_{1,RMS}$ and wherein the imaging module includes acquiring, image data including magnetization transfer information from the exchangeable magnetization from protons in the subject in response to the pulse sequence;
b) analyzing the effects of the RF energy on the image data to identify inhomogeneous lines formed by a summation of multiple sublines centered at multiple different frequencies; and
c) generating a report pertaining to inhomogeneous magnetization transfer occurring in the subject in response to the pulse sequence based on the inhomogeneous lines identified in step b).

11. The method of claim 10 wherein the concentrated pulse cycle includes an RF duty cycle of less than 50 percent.

12. The method of claim 11 wherein the RF duty cycle is 5 percent.

13. The method of claim 10 wherein the concentrated pulse cycle includes RF pulses that are distributed unevenly during the preparation module.

14. The method of claim 10 further comprising selecting parameters of the RF pulses and the concentrated pulse cycle to achieve a $B_{1,RMS}$ comparable to a distributed RF pulse cycle.

15. The method of claim 10 further comprising using the magnetization transfer information to form at least one set of magnetization transfer images.

16. The method of claim 15 wherein step b) further comprises comparing the at least one set of magnetization transfer images with a second set of images acquired using RF pulses having at least one of magnitudes or pulse timing patterns that differ from the plurality of RF pulses of the preparation module.

17. The method of claim 16 further comprising generating the report pertaining to inhomogeneous magnetization transfer using the comparison.

18. The method of claim 10 wherein the exchangeable magnetization information pertains to protons that form a part of a methylene chain of lipid bilayers.

19. The method of claim 10 wherein the RF pulses include pulses at both a first frequency and a second frequency that is different from the first frequency.

20. The method of claim 10 wherein step a) includes acquiring first frequency image data associated with applying the RF energy at a first frequency, second frequency image data associated with applying the RF energy at a second frequency, and dual frequency image data associated with applying the RF energy at both the first and second frequency.

21. The method of claim 20 wherein step b) includes analyzing differences in the first frequency image data, the second frequency image data, and the dual frequency image data acquired in step a) that are associated with magnetization transfer from inhomogeneous lines formed by a summation of multiple sublines centered at multiple different frequencies.

22. The method of 10 wherein the RF pulses and the concentrated pulse cycle are configured to provide an increase of signal associated with inhomogeneous magnetization transfer over a distributed RF pulse cycle at a common $B_{1,RMS}$.

23. A method for producing a report about a subject from data collected from the subject using a magnetic resonance imaging (MM) system, the method including steps comprising:
a) directing the MRI system to perform at least one pulse sequence that includes performing a preparation module and an imaging module, wherein the preparation module includes applying a plurality of radio frequency (RF) pulses at least at one frequency and with a concentrated pulse cycle to manipulate exchangeable magnetization from protons in the subject to achieve at least a 2 fold increase over RF pulses that are distributed uniformly during the preparation module with the same $B1_{,RMS}$ and wherein the imaging module includes acquiring, image data including magnetization transfer information from the exchangeable magnetization from protons in the subject in response to the pulse sequence;

b) directing the MRI system to perform at least one pulse sequence that includes performing a preparation module and an imaging module, wherein the preparation module includes applying a plurality of radio frequency (RF) pulses at least at one frequency and with a distributed pulse cycle to manipulate exchangeable magnetization from protons in the subject and wherein the imaging module includes acquiring, image data including magnetization transfer information from the exchangeable magnetization from protons in the subject in response to the pulse sequence;

c) analyzing the different effects of RF energy on the image data of a) and b) to identify inhomogeneous lines formed by a summation of multiple sublines centered at multiple different frequencies or to characterize the exchange times of homogenous or inhomogeneous lines; and d) generating a report pertaining to inhomogeneous magnetization transfer or homogeneous magnetization transfer occurring in the subject in response to the pulse sequence based on the inhomogeneous lines or exchange time effects identified in step c).

* * * * *

UNITED STATES PATENT AND TRADEMARK OFFICE
CERTIFICATE OF CORRECTION

PATENT NO. : 10,718,841 B2
APPLICATION NO. : 16/069245
DATED : July 21, 2020
INVENTOR(S) : David Alsop et al.

It is certified that error appears in the above-identified patent and that said Letters Patent is hereby corrected as shown below:

In the Specification

Column 1, Line 27, "("MW")" should be --("MR")--.

Column 2, Line 21, "hound" should be --bound--.

Column 3, Line 28, "RE" should be --RF--.

Column 4, Line 2, "front" should be --from--.

Column 5, Line 51, "bums" should be --burns--.

Column 6, Line 41, "he" should be --be--.

Column 7, Line 27, "sonic" should be --some--.

Column 8, Line 24, "The ratio" should be --The IHMT ratio--.

Column 9, Line 45, "he" should be --be--.

Column 11, Line 44, "fined" should be --fitted--.

Column 12, Line 3, "in" should be --In--.

Column 12, Line 9, "RE" should be --RF--.

Column 14, Line 29, "he" should be --be--.

Column 15, Line 5, "tactor" should be --factor--.

Signed and Sealed this
Twenty-second Day of December, 2020

Andrei Iancu
*Director of the United States Patent and Trademark Office*

CERTIFICATE OF CORRECTION (continued)
U.S. Pat. No. 10,718,841 B2

Column 16, Line 24, "example" should be --(for example--.

Column 17, Line 24, "duly" should be --duty--.

Column 17, Line 29, "$B_{1,RMS}$ as that" should be --$B_{1,RMS}$ that--.

Column 17, Line 33, "cycle. While" should be --cycle, while--.

Column 18, Line 17, "FIG. 49" should be --FIG. 4B--.

In the Claims

Column 23, Claim 10, Line 55, "(MM)" should be --(MRI)--.

Column 23, Claim 10, Line 56, "MM" should be --MRI--.

Column 23, Claim 10, Line 64, "pulse" should be --pulses--.

Column 24, Claim 23, Line 62, "(MM)" should be --(MRI)--.